(12) United States Patent
Sakakibara

(10) Patent No.: US 6,188,639 B1
(45) Date of Patent: Feb. 13, 2001

(54) SYNCHRONOUS SEMICONDUCTOR MEMORY

(75) Inventor: Kenichi Sakakibara, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/397,559

(22) Filed: Sep. 16, 1999

(30) Foreign Application Priority Data

Sep. 18, 1998 (JP) .................................. 10-264474

(51) Int. Cl.[7] .................................................. G11C 8/00
(52) U.S. Cl. ................ 365/233; 365/230.08; 365/189.05
(58) Field of Search .............................. 365/233, 230.08, 365/189.05

(56) References Cited

U.S. PATENT DOCUMENTS

| | | | | |
|---|---|---|---|---|
| 5,623,453 | * | 4/1997 | Shinozaki | 365/233 |
| 5,986,918 | * | 11/1999 | Lee | 365/105 |
| 6,031,788 | * | 2/2000 | Bando et al. | 365/233 |
| 6,034,916 | * | 3/2000 | Lee | 365/233 |

FOREIGN PATENT DOCUMENTS

| 2605576 | 2/1997 | (JP) . |
|---|---|---|
| 9-167485 | 6/1997 | (JP) . |

* cited by examiner

Primary Examiner—David Nelms
Assistant Examiner—Connie C. Yoha
(74) Attorney, Agent, or Firm—Darryl G. Walker

(57) ABSTRACT

According to one embodiment, a semiconductor memory (100) can include a firststage control circuit (106) that generates a first stage control signal $\phi 0$, a data input/output (DQ) control circuit (116) that generates a DQ control signal $\phi 1$ based on the first stage control signal $\phi 0$ and a row address enable signal RASE, and a data mask (DQM) control circuit (114) that generates a DQM control signal $\phi 2$ based on the first stage control signal $\phi 0$, row address enable signal RASE, and a column address strobe (CAS) latency equal to one value (CLT1). A DQ first-stage circuit (112) is coupled to the DQ control circuit (116) and a DQM first-stage circuit (110) is coupled to the DQM control circuit (116). The DQ and DQM first-stage circuits (110 and 112) can be deactivated when the RASE signal, CASE signals are inactive and the CAS latency is greater than one.

20 Claims, 5 Drawing Sheets

SYNCHRONOUS SEMICONDUCTOR MEMORY

TECHNICAL FIELD

The present invention relates generally to a synchronous semiconductor memory, and more particularly to a synchronous semiconductor memory that includes first-stage input circuits for receiving external signals having reduced power consumption.

BACKGROUND OF THE INVENTION

Among the various types of memory devices are dynamic random access memories (DRAMs). A DRAM is typically a random access memory (RAM) that requires a refresh operation. One type of DRAM that can have an accelerated operation is a synchronous DRAM (SDRAM). A SDRAM can operate in synchronism with an external clock, and can have various operational values that can be set in synchronism with an external clock. Such operational values can include a column address strobe (CAS) latency, a burst length, and a wrap type.

A burst length can indicate the number of addresses that can be sequentially accessed with an initial address value. A wrap type can indicate a particular order in which addresses are accessed in a burst operation.

A CAS latency can indicate the number of clock cycles between the application of a command and the availability of data. Referring now to FIG. 6, a timing diagram is set forth illustrating the relationship between a clock signal CLK and a CAS latency. FIG. 6 illustrates an example of a CAS latency of "2." A command (such as a read command) is applied with an address (such as a column address). Due to the CAS latency value of 2, the corresponding data will be output two cycles after the command and address are entered.

Referring now to FIG. 7, a SDRAM is set forth in a block diagram. The SDRAM is disclosed in Japanese Patent Application Laid-Open No. 9-167485 ("Synchronous Semiconductor Memory Device"). As shown in FIG. 7, the SDRAM is designated by the general reference character 700 and includes a control buffer circuit 702 and a data mask (DQM) buffer circuit 704. A control buffer circuit 702 can receive external control signals, including a row address strobe signal (/RAS), a column address strobe signal (/CAS), and a write enable signal (/WE). Such external control signals can be input in synchronism with an external clock signal (CLK). The DQM buffer circuit 704 can receive a mask enable signal (DQM) that can mask output read data in synchronism with the clock signal CLK. The DQM signal can also mask input write data. The output of the DQM buffer circuit 704 is an internal mask enable signal (QM).

The SDRAM 700 can further include a command decoder 706 and a read enable (RE) generating circuit 708. The command decoder 706 can decode the output of control buffer circuit 702 and generate a read command (a read operation trigger signal R). A read command can initiate a data readout operation. The RE generating circuit 708 can receive a read command and count a number of clock cycle periods equal to a designated burst length. A read enable signal OEMF can be activated and de-activated according to the burst length count.

As further shown in FIG. 7, an output control circuit 710 can receive the read enable signal OEMF and the internal mask enable signal QM, and provide a data output enable signal (OEM). However, the read enable signal OEMF can also be input to a select circuit 712 of the read enable generating circuit 708. The select circuit 712 can provide the read enable signal OEMF as an output when the CAS latency value is 1, otherwise it can output a logic high (power supply VDD) voltage.

Accordingly, the SDRAM 700 of FIG. 7 can generate a data output enable (OEM) that can be activated or inactivated with the same timing as a clock signal CLK. This can prevent non-masked valid data from being erroneously masked, or masked valid data from not being masked due to erroneous SDRAM operation.

Furthermore, in the SDRAM 700 the data (DQ) pins and the input pins of the control buffer circuit 702 are separate, which can result in reduced power consumption in the first stage circuits associated with these pins. For example, when row address strobe (RAS) circuits are inactive (such as during precharge standby), CAS circuits are not activated, and thus the DQ signal can be inactive. In addition, there may be other modes where the RAS circuits may be activated, while the CAS circuits remain inactive (such as an auto refresh operation or a CAS-before-RAS "CBR" refresh). In such modes, the DQ signal can be inactive.

Referring now to FIG. 8, another example of a SDRAM is illustrated. The SDRAM is disclosed in Patent Publication No. 2605576 (Japanese Patent Application Laid-Open No. 6-290583, "Synchronous Semiconductor Memory"). FIG. 8 shows a clock control circuit 800 for a SDRAM that can receive a clock signal CLK and a clock enable signal CKE, and generate a main signal $\phi 5$. The main signal $\phi 5$ can be a one-shot signal that is the main signal within the SDRAM. The pulse width of the main signal $\phi 5$ is not dependent upon the width of the low and/or high portions of the clock signal CLK.

In FIG. 8, the clock enable signal CKE can control whether or not the main signal $\phi 5$ is generated.

The SDRAM clock control circuit 800 is shown to include one first stage circuit 802 that can generate a control signal $\phi 1$ from the clock signal CLK and another first stage circuit 804 that can generate an internal clock enable signal $\phi 2$ from the clock enable signal CKE. The clock control circuit 800 further includes a first control circuit 806, second control circuit 808, and third control circuit 810. The first control circuit 806 includes a first one-shot signal generating circuit 812 that can receive the control signal $\phi 1$ and generate a timing signal $\phi 3$ for the second control circuit 808, and a second one-shot signal generating circuit 814 that can receive the control signal $\phi 1$ and generate main signal $\phi 5$. The second one-shot signal generating circuit 814 can be enabled or disabled by a clock control output signal $\phi 4$ generated by the second control circuit 808.

The second control circuit 808 receives the internal clock enable signal $\phi 2$, and shifts it through a D-type flip-flop 816 and a D-type latch circuit 818 according to the timing signal $\phi 3$.

The third control circuit 810 can receive the outputs of the D-type flip-flop 816, a Dtype latch circuit 818, and first stage circuit 804, and generate the third control output $\phi 7$.

The clock control circuit 800 can provide proper operation, even when a CAS latency value is as low as one.

Due to improvements in setup times, hold times and cycle times for the conventional SDRAM, the clock control circuit 800 can further provide current savings in the first control circuit 806, that have typically been found only in asynchronous semiconductor memories. Such current savings can be accomplished by deactivating the second one-shot signal generating circuit 814 one clock cycle following a transition in the clock enable signal CKE.

While the above-described conventional SDRAM approach can provide some reductions in current consumption, such approaches provide no reduction in the amount of current consumed by a first stage circuit that receives a clock signal (such as first stage circuit 802). Such further improvements in current reduction are desirable, as lower power SDRAMs are in greater demand due to the prevalence of portable equipment that utilizes such devices.

It would thus be desirable further reduce the power consumption of a high speed SDRAM.

SUMMARY OF THE INVENTION

The present invention may address the above mentioned problems, and can include a synchronous dynamic random access memory (SDRAM) having a first-stage control circuit that can generate a first stage control signal based on a clock signal, a clock enable signal, and a column address enable signal CASE. The SDRAM can further include a data input/output (DQ) first-stage control circuit coupled to a first-stage DQ circuit, and a data input/output mask (DQM) first-stage control circuit coupled to a first-stage DQM circuit. The DQ first-stage control circuit can generate a DQ control signal based on the first stage control signal and a row address enable signal RASE. The DQM first-stage control circuit can generate a DQM control signal based on the first stage control signal, RASE signal, and an indication for a column address strobe (CAS) latency that is greater than one.

In this arrangement, if the CASE signal and RASE signal are inactive, and the CAS latency is two or greater, the DQ and DQM first-stage control circuits can be deactivated.

Further, the present invention may also include a SDRAM having a first-stage control circuit that can generate a first stage control signal based on a clock signal, a clock enable signal, and a column address enable signal CASE. The SDRAM can further include an input/output (I/O) first-stage control circuit coupled to a first-stage DQ circuit and a first-stage DQM circuit. The I/O first-stage control circuit can generate an I/O control signal based on the first stage control signal and a row address enable signal RASE.

In this arrangement, if the CASE signal and RASE signal are inactive, the DQ and DQM first-stage control circuits are deactivated.

According to one aspect of the embodiments, the present invention can provide a control signal for DQM and/or DQ first-stage circuits. Such circuits can thus be deactivated according to particular modes, and/or states, and/or operations of the SDRAM. Such modes/states/operations can include a burst operation, a precharge standby state, a power down mode, and a non-power down mode.

DETAILED DESCRIPTION OF THE EMBODIMENTS

Various embodiments of the present invention will now be further described with reference to a number of drawings.

Figure 1:
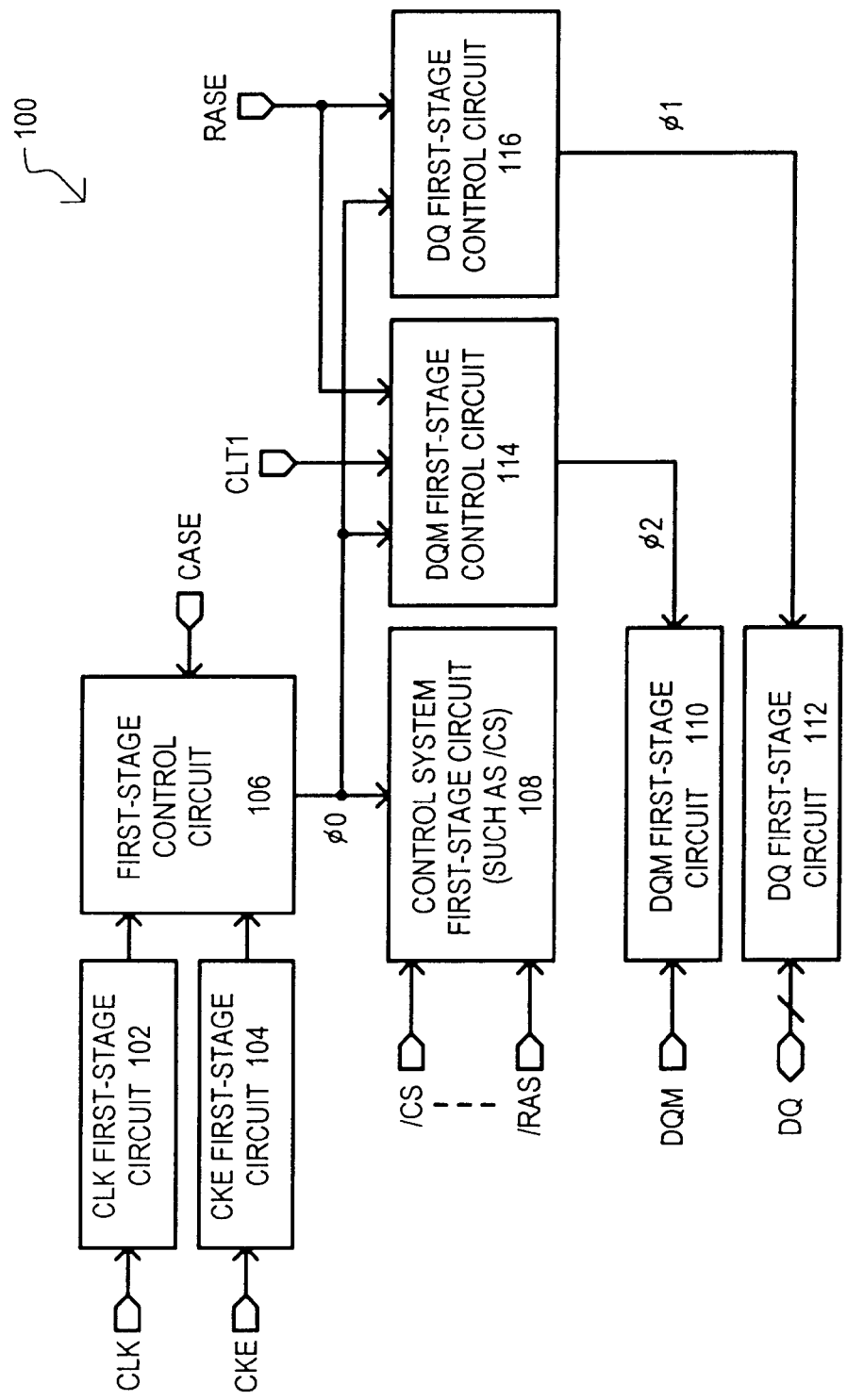
FIG. 1 is a block diagram of one embodiment of the present invention.

Referring now to FIG. 1, a block diagram of a synchronous semiconductor memory, such as a synchronous dynamic random access memory (SDRAM), according to a first embodiment. The synchronous semiconductor memory is designated by the general reference character 100, and can include a clock (CLK) first-stage circuit 102, a clock enable (CKE) first-stage circuit 104, and a first-stage control circuit 106. The CLK first-stage circuit 102 can receive a clock signal CLK, and the CKE first-stage circuit 104 can receive a clock enable signal CKE. The first-stage control circuit 106 can receive the outputs of the CLK first-stage circuit 102 and the CKE first-stage circuit 104, as well as a column address enable signal CASE, and generate a first-stage control signal $\phi 0$.

One skilled in the art would recognize that the column address enable signal can correspond to an internal signal that indicates and/or triggers a column-wise operation within the SDRAM. As but a few of the many possible examples, a CASE signal can enable and/or be synchronous with and/or be generated from a column access signal that can be generated by the entry of a particular command and/or series of input signals, and/or a column decoder circuit that can generate column select signals in response to a particular column address.

One skilled in the art would also recognize that the row address enable signal (RASE) could correspond to an internal signal that indicates and/or triggers a row-wise operation within the SDRAM. As but a few of the many possible examples, a RASE signal can enable and/or be synchronous with and/or be generated from a row access signal that can correspond to the entry of a particular command or series of input signals, and/or a word line enable signal that can enable the activation of word lines, and/or word line select signals that can select word lines.

The semiconductor memory 100 can further include a control system first-stage circuit 108, a data mask (DQM) first-stage circuit 110, a data (DQ) first-stage circuit 112. The control system first-stage circuit 108 can receive the first-stage control signal $\phi 0$, as well as various external system signals. Such external system signals can include a chip select (/CS) signal and a row address strobe (/RAS) signal, to name but two examples. The DQM first-stage circuit 110 can receive a mask enable signal DQM and the DQ first-stage circuit 112 can receive input/output signals DQ.

One skilled in the art would recognize that in one particular arrangement, the control system, DQ, and DQM first-stage circuits (108, 110 and 112) can be coupled to external nodes of the SDRAM (such as input/output pins). When enabled, such circuits can drive internal nodes of the SDRAM according to the values on the external nodes.

Also shown in FIG. 1 are a DQM first-stage control circuit 114 and DQ first-stage control circuit 116. The DQM first-stage control circuit 114 can receive the first stage control signal $\phi 0$, a CAS latency one signal CLT1, and a row address enable signal RASE, and generate a DQM control signal $\phi 2$. The DQ first-stage control circuit 116 can receive the first stage control signal $\phi 0$ and the row address enable signal RASE, and generate a DQ control signal $\phi 1$.

One skilled in the art would recognize that the DQ and DQM first-stage control circuits (114 and 116) can be conceptualized as an I/O control system that provides control signals to the DQ and DQM first-stage circuits (110 and 112).

Figure 2:
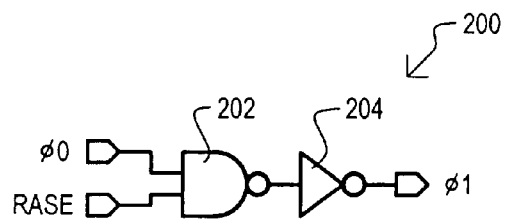
FIG. 2 is an example of a data (DQ) first-stage control circuit that may be used in the embodiment of FIG. 1.

Referring now to FIG. 2, a schematic diagram is set forth illustrating a DQ first-stage control circuit 200. The DQ first-stage control 200 circuit may be utilized within the DQ first-stage control circuit 116 of FIG. 1.

The DQ first-stage control circuit 200 can include a NAND gate 202 and an inverter 204. The NAND gate 202 can receive a first stage control signal $\phi 0$ as one input and a row address enable signal RASE as another input. The output of NAND gate 202 can be inverted by inverter 204 to generate the DQ control signal $\phi 1$.

One skilled in the art would recognize that in the particular arrangement of FIG. 2, if the row address enable signal RASE is active (high), a DQ control signal $\phi 1$ can be generated in response to the first stage control signal $\phi 0$. However, if the RASE signal is inactive (low) (during a precharge standby state, as just one example), the DQ control signal $\phi 1$ will be inactive.

Figure 3:
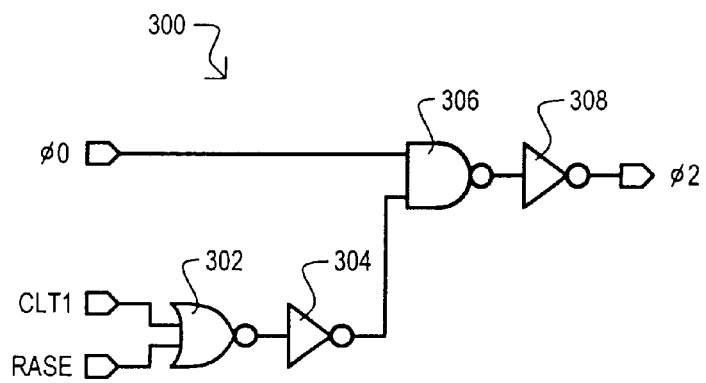
FIG. 3 is an example of a data mask (DQM) first-stage control circuit that may be used in the embodiment of FIG. 1.

Referring now to FIG. 3, a DQM first-stage control circuit is set forth in a schematic diagram, designated by the general reference character 300. The DQM first-stage control circuit 300 circuit may be utilized in the DQM first-stage control circuit 114 of FIG. 1.

The DQM first-stage control circuit 300 can include a NOR gate 302, an inverter 304, a NAND gate 306, and another inverter 308. The NOR gate 302 can receive a column latency one signal CLT1 and a row address enable signal RASE, as inputs. The output of NOR gate 302 can be inverted by inverter 304 and provided as an input to NAND gate 306. The other input to NAND gate 306 can be a first stage control signal $\phi 0$. The output of NAND gate 306 can be inverted by inverter 308.

One skilled in the art would recognize that in the particular arrangement of FIG. 3, if the row address enable signal RASE is active (high) or the CAS latency equal to one signal CLT1 is active (high), a DQM control signal $\phi 2$ can be generated in response to the first stage control signal $\phi 0$. However, if both the RASE signal and CLT1 signals are inactive (low) (during a precharge standby state, as just one example), the DQ control signal $\phi 2$ will be inactive.

Figure 4:
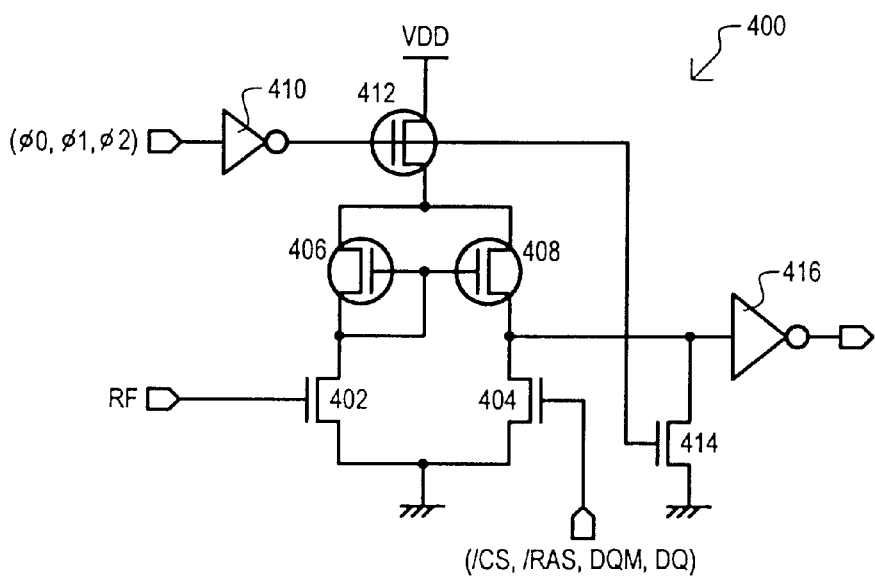
FIG. 4 is an example of a first-stage circuit that may be used in the embodiment of FIG. 1.

Referring now to FIG. 4, a first-stage circuit is set forth in a schematic diagram, and designated by the general reference character 400. The first-stage circuit 400 may be utilized in the control system first-stage circuit 108 and/or the DQM first-stage circuit 110 and/or the DQ first-stage circuit 112 of FIG. 1.

The first-stage circuit 400 of FIG. 4 can include various insulated gate field effect transistors (IGFETs), which are referred to herein as a particular type of IGFET, the metal-oxide-semiconductor (MOS) transistor. In particular, the first-stage circuit 400 can include a first n-channel MOS (NMOS) transistor 402 having a gate coupled to a reference voltage RF, and a second NMOS transistor 404 having a gate coupled to an external control signal. Such an external control signal can include a /CS, /RAS, DQM or DQ signal, to name but a few possible examples. Also included is a first p-channel MOS (PMOS) transistor 406 having a drain coupled to the drain of transistor 402, and a second PMOS transistor 408 having a drain coupled to the drain of transistor 404. The sources of PMOS transistors 406 and 408 can be coupled together. Further, the sources of NMOS transistors 402 and 404 can be commonly coupled to a low power supply (grounded).

One skilled in the art would recognize that NMOS transistors 402 and 404 can form a differential pair, and PMOS transistors 406 and 408 can form an active load. Thus, provided NMOS transistors 402 and 404 are matched with one another, and PMOS transistors 406 and 408 are matched with one another, the reference voltage RF can be used to distinguish between high and low logic levels of the signal applied to the gate of NMOS transistor 404.

The first-stage circuit 400 also includes an input inverter 410, a third PMOS transistor 412, a third NMOS transistor 414 and an output inverter 416. Input inverter 410 can receive an enabling signal. As just a few examples, such an enabling signal can be a first stage control signal $\phi 0$ if the first-stage circuit 400 is included in a control system first-stage circuit, a DQM control signal $\phi 2$ if the first-stage circuit 400 is included in a DQM first-stage circuit, or a DQ control signal $\phi 1$ if the first-stage circuit 400 is included in a DQ first-stage circuit.

One skilled in the art would recognize that in the particular arrangement of FIG. 4, PMOS transistor 412 provides an enabling current path for a differential amplifier.

One skilled in the art would also recognize that in the particular arrangement of FIG. 4, the gate of NMOS transistor 404 can be coupled to an external signal input node (such as an SDRAM input pin). Further, the output of inverter 416 can drive an internal node according to the value on the external signal input node (when enabled).

Input inverter 410 can invert its input signal and apply it to the gate of PMOS transistor 412. PMOS transistor 412 can have a source-drain path coupled between the common sources of PMOS transistors 406 and 408 and a high power supply (VDD). Thus, in the event an enabling signal (such as $\phi 0$, $\phi 1$ or $\phi 2$) is active (high), PMOS transistor 412 can be turned on, enabling a differential amplifier formed by PMOS transistors 406 and 408, and NMOS transistors 402 and 404.

The output of input inverter 410 can also be coupled to the gate of NMOS transistor 414. NMOS transistor 414 can have a source-drain path coupled between a low power supply, and the drain-drain connection of PMOS transistor 408 and NMOS transistor 404. The drain-drain connection of PMOS transistor 408 and NMOS transistor 404 can also be coupled to output inverter 416.

Having described a particular construction for one embodiment of the present invention, the operation of a SDRAM according to the embodiment is described below.

In a burst mode of operation, the column address enable signal CASE is active, thus a column address strobe system can be activated to perform a read or write operation. With the CASE signal active, assuming the CLK and CKE signals are also active, the first-stage control circuit 106 will generate a first stage control signal $\phi 0$ that can activate the control system first-stage control circuit 108, DQM first stage control circuit 114 and DQ first stage control circuit 116.

In a non-burst mode, a SDRAM can operate in a power-down mode or a non-power down mode. In one arrangement, the mode can be determined by the CKE signal. In particular, if the CKE signal is high, the SDRAM can be placed in a non-power down mode. If the CKE signal is low, the SDRAM can be placed in a power down mode.

In a non-power down mode, a RAS system can be inactive, resulting in the RASE signal being inactive (low). With the RASE signal low, the DQM first-stage control circuit 114 and DQ first-stage control circuit 116 can be inactive, while the control system first stage control circuit 108 is active. However, a RAS system can also be active, resulting in the RASE signal being active (high). With the RASE signal high, the control system first stage control circuit 108, the DQM first-stage control circuit 114, and DQ first-stage control circuit 116 can be active.

In a power-down mode, the φ0 signal can be deactivated. Thus, the control system first-stage control circuit 108, the DQM first-stage control circuit 114, and DQ first-stage control circuit 116 can all be deactivated.

Further, as noted above, the DQ first-stage control circuit 116 utilizes the first stage control signal φ0 and row address enable signal RASE to generate the DQ control signal φ1. Thus, when the RASE signal is inactive (such as during a precharge operation or standby mode), the DQ control signal φ1 is inactive. This, in turn, will deactivate the DQ first-stage circuit 112.

Still further, the DQM first-stage control circuit 114 can buffer the first stage control signal φ0 according to the column latency one signal CLT1 or the RASE signal. Thus, when the CAS latency is set to one, the DQM first-stage circuit 110 can be enabled. However, when the CAS latency is not one and the RASE signal is inactive (such as during a precharge operation or standby mode) the DQM first-stage circuit 110 can be disabled.

The CLT1 signal can be supplied to the DQM first-stage control circuit 114 to establish if a CAS latency is one or not. In a typical read operation the latency of a mask enable signal DQM can be two. Thus, if a CAS latency is one and the DQM first-stage circuit 110 is activated in response to the RASE signal instead of the CLT1 signal, the DQM first-stage circuit 110 may be delayed by a clock signal. In this way, the CLT1 signal can enable proper operation when a CAS latency is set to one.

It is understood that the embodiment of FIG. 1 represents but one embodiment and the present invention should not construed as being limited thereto. As just one example, some recent SDRAM specifications do not support CAS latencies of one. Accordingly, the present invention may include an embodiment that does not include structures for implementing CAS latencies of one. One such embodiment is set forth in FIG. 5.

Figure 5:
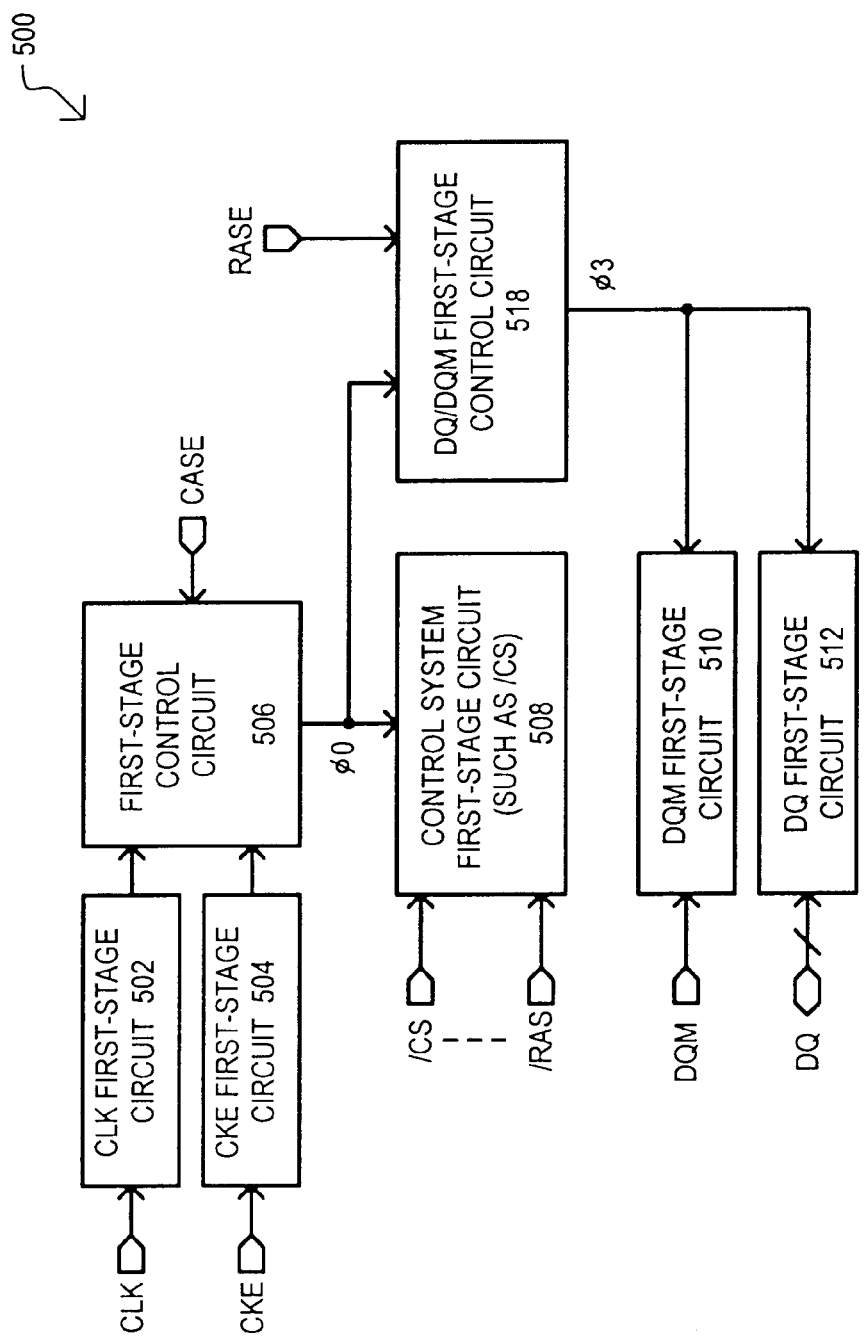
FIG. 5 is a block diagram of another embodiment of the present invention.
Figure 6:
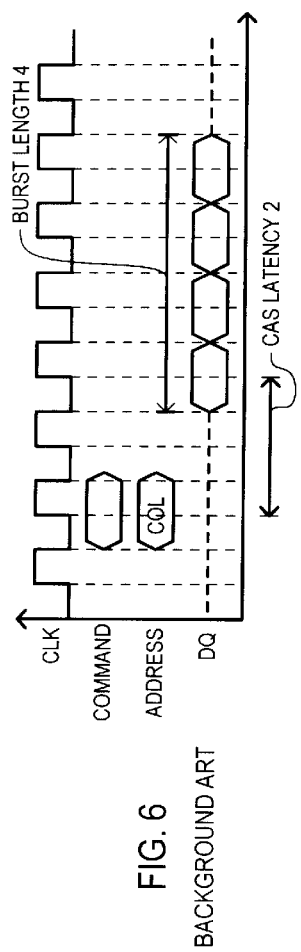
FIG. 6 is a timing diagram illustrating a column address strobe (CAS) latency for a synchronous dynamic random access memory (SDRAM).
Figure 7:
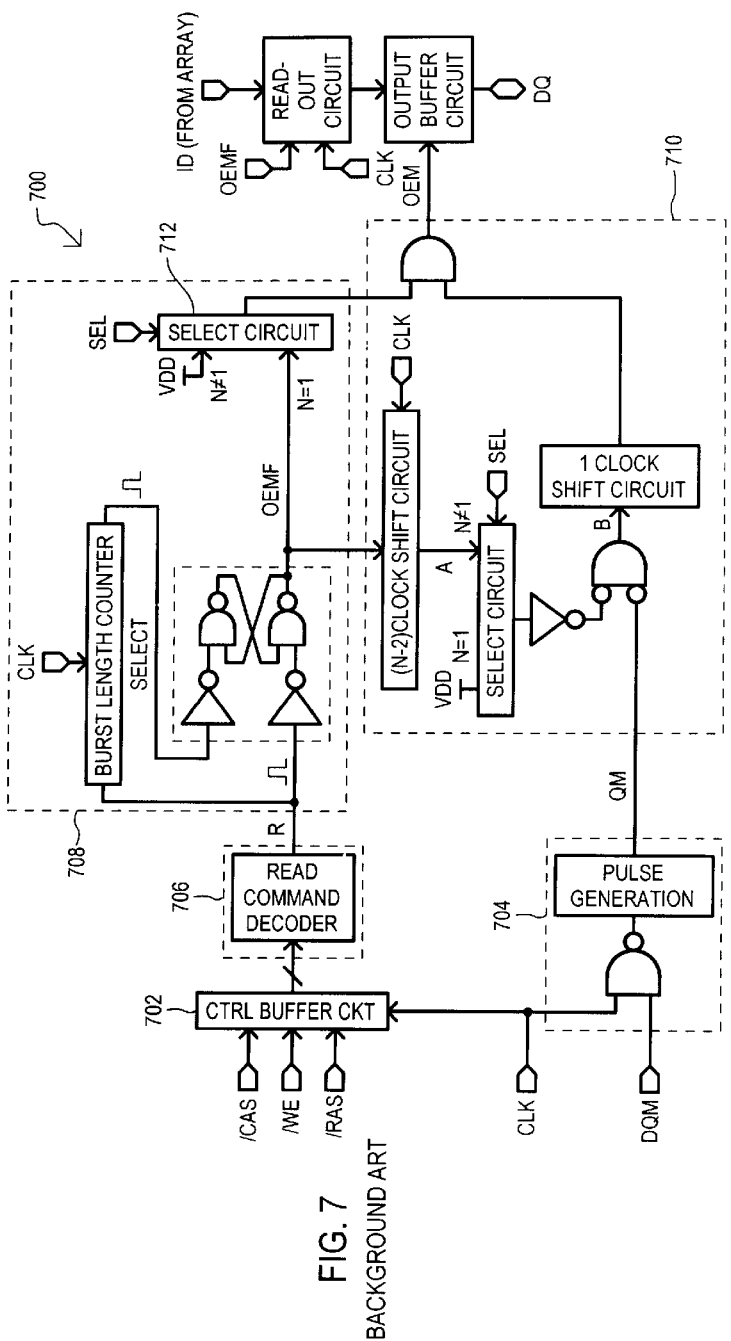
FIG. 7 is a block diagram of a conventional SDRAM.
Figure 8:
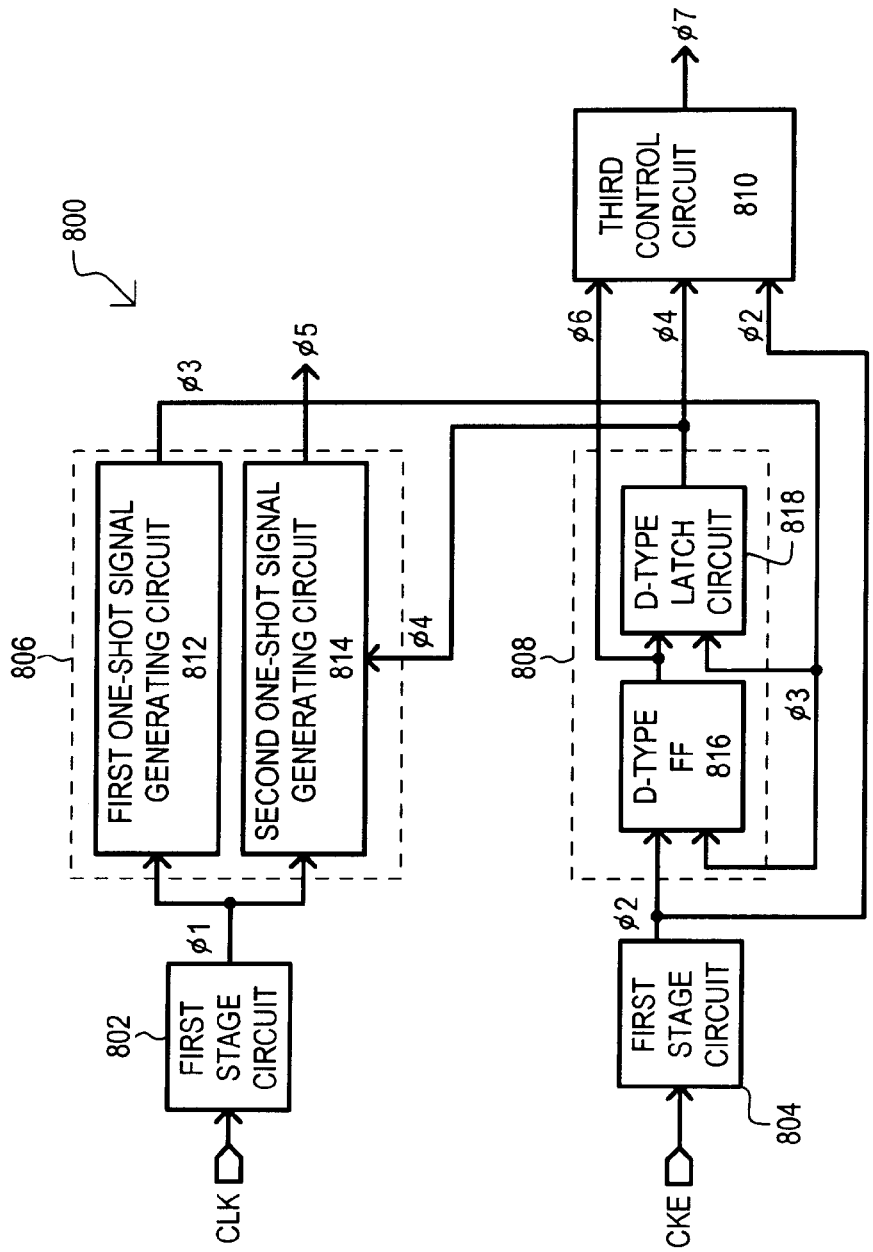
FIG. 8 is a block diagram of a conventional SDRAM clock control circuit.

Referring now to FIG. 5, another embodiment is designated by the general reference character 500, and can include some of the same general constituents as the embodiment of FIG. 5. To that extent, like circuit blocks will be referred to by the same reference character, but with the first digit being a "5" instead of a "1."

The embodiment of FIG. 5 can include a CLK first-stage circuit 502, a CKE first-stage circuit 504, a first stage control circuit 506, a control system first-stage circuit 508, a DQM first-stage circuit 510, and a DQ first-stage circuit 512.

The synchronous semiconductor memory 500 can further include a DQ/DQM first-stage control circuit 518. The DQ/DQM first-stage control circuit 518 can activate the DQM first-stage circuit 510 and DQ first-stage circuit 512.

One skilled in the art would recognize that the DQ/DQM first-stage control circuit 518 can be conceptualized as an I/O control system that provides control signals to the DQ and DQM first-stage circuits (510 and 512).

In particular configurations, the control system first-stage control circuit 508 and/or the DQM first-stage circuit 510 and/or the DQ first-stage circuit 512 can include structures such as that set forth in FIG. 5. Further, the DQ/DQM first-stage control circuit 518 can include a structure such as that set forth in FIG. 2.

In this way, a DQM first-stage circuit (such as 110 in FIG. 1 and 510 in FIG. 5) can be deactivated in a non-power down mode during stand-by. In this way, the precharge standby current in a non-power down mode can be reduced.

It is understood that while the various embodiments have illustrated SDRAMs that can advantageously disable DQ and DQM first-stage circuits according to particular modes and states of operation, other such input and/or output circuits can be disabled in a like manner.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A synchronous dynamic random access memory (SDRAM), comprising:

a first-stage control circuit that can receive a clock signal, a clock enable signal, and a column address enable signal and provide a first-stage control signal, the first stage control signal being deactivated in response to the column address enable signal being deactivated;

an input/output (I/O) control system that can receive the first stage control signal and a row address enable signal and provide at least one I/O control system signal, the I/O control system signal being deactivated in response to the row address enable signal being deactivated; and an I/O circuit that can be activated and deactivated by the I/O control system signal.

2. The SDRAM of claim 1, further including:

an I/O mask circuit that can be activated and deactivated by the I/O control system signal.

3. The SDRAM of claim 1, wherein:

the I/O control system includes
an I/O control circuit that can receive the first stage control signal and a row address enable signal and provide an I/O control signal, the I/O control signal being deactivated when the row address enable signal is deactivated, and
an I/O mask control circuit that can receive the first stage control signal, the row address enable signal, and a column address strobe (CAS) latency value, and provide an I/O mask control signal, the I/O mask control signal being deactivated when the CAS latency value is inactive and the row address enable signal is inactive; and
an I/O mask circuit that can be activated and deactivated by the I/O mask control signal.

4. The SDRAM of claim 3, wherein:

the I/O control circuit can include a logic gate having a first input coupled to the first stage control signal, a second input coupled to the row address enable signal, and an output that provides the I/O control signal.

5. The SDRAM of claim 3, wherein:

the I/O mask control circuit can include
a first logic gate having a first input coupled to a column latency value, a second input coupled to the row address enable signal, and an output, and
a second logic gate having a first input coupled to the first stage control signal, a second input coupled to the output of the first logic gate, and an output that provides the I/O mask control signal.

6. The SDRAM of claim 3, wherein:
the I/O circuit includes a differential amplifier having an enabling current path that can be activated in response to the I/O control signal.

7. The SDRAM of claim 3, wherein:
the I/O mask circuit includes a differential amplifier having an enabling current path that can be activated in response to the I/O mask control signal.

8. A synchronous semiconductor memory device, comprising:
an input/output (I/O) control system that can receive an internal control signal and a row address enable (RASE) signal, the I/O control system activating at least one circuit control signal in response to the internal control signal when the RASE signal has a first value, and disabling the circuit control signal in response to the RASE signal having a second value; and
at least one I/O circuit coupled to external I/O values that can drive internal I/O signals in response to the external I/O values when enabled, the at least one I/O circuit being enabled when the at least one circuit control signal is activated, and disabled when the at least one circuit control signal is disabled.

9. The synchronous semiconductor memory device of claim 8, wherein:
the at least one I/O circuit includes
a data I/O circuit coupled to at least one external data I/O value that can drive an internal data signal in response to the external data I/O value when enabled, and
a data mask circuit coupled to at least one external data mask value that can drive an internal data mask signal in response to the external data mask value when enabled,
the data I/O circuit and data mask circuit being enabled when a common circuit control signal is activated, and disabled when the common circuit control signal is disabled.

10. The synchronous semiconductor memory device of claim 8, wherein:
the at least one circuit control signal includes an I/O control signal; and
the I/O control system includes an I/O control circuit that receives the internal control signal and the RASE signal and generates the I/O control signal, the I/O control signal including the logical combination of the internal control signal and the RASE signal.

11. The synchronous semiconductor memory device of claim 10, wherein:
the I/O control circuit includes a logic gate having one input coupled to the internal control signal and another input coupled to the RASE signal.

12. The synchronous semiconductor memory device of claim 11, further including:
an I/O circuit that can be enabled and disabled according to the I/O control signal, the I/O circuit driving internal circuit nodes in response to external data values when enabled, and driving the internal circuit nodes to a predetermined state when disabled.

13. The synchronous semiconductor memory device of claim 8, wherein:
the at least one circuit control signal includes a mask control signal; and the I/O control system includes a mask control circuit that receives the internal control signal and the RASE signal and generates the mask control signal, the mask control signal including the logical combination of the internal control signal and the RASE signal.

14. The synchronous semiconductor memory device of claim 13, wherein:
the mask control circuit further receives an operating latency value, and the mask control signal includes the logical combination of the internal control signal and the RASE signal or the operating latency value.

15. The synchronous semiconductor memory device of claim 14, wherein:
the mask control circuit includes
a first logic gate having one input coupled to the internal control signal and another input coupled to a second logic gate output, and
a second logic gate having one input coupled to the operating latency value and another input coupled to the RASE signal.

16. The synchronous semiconductor memory device of claim 13, further including:
a mask circuit that can be enabled and disabled according to the mask control signal, the mask circuit driving at least one internal circuit node in response to an external mask data value when enabled, and driving at least one internal circuit node to a predetermined state when disabled.

17. A synchronous dynamic random access memory (SDRAM) having a precharge stand-by state, power-down mode, a non-power down mode, and column address latency that may be set to a value of at least one clock cycle, the SDRAM comprising:
a plurality of external input/output (I/O) signal nodes;
a data I/O system coupled to the external I/O signal nodes that drives internal nodes in response to the potential of the external I/O signal nodes, the data I/O circuit being disabled when the SDRAM is in the non-power down mode and the precharge stand-by state.

18. The SDRAM of 17, further including:
the external I/O signal nodes include data I/O signal nodes and at least one mask data signal node;
the data I/O system includes
a data I/O circuit that drives at least one internal data I/O node in response to the potential of the at least one data I/O signal node, the data I/O circuit being disabled when the SDRAM is in the non-power down mode and the precharge stand-by state, and
a data mask circuit that drives internal mask data nodes in response to the potential of the mask data signal nodes, the data mask circuit being disabled when the SRDAM is in the non-power down mode and the precharge stand-by state.

19. The SDRAM of 18, further including:
a first-stage control circuit that generates a first stage control signal that is enabled in a non-power down mode and disabled in a power down mode; and
the data I/O system receives the first stage control signal and a row address enable signal as inputs, and provides a data I/O system signal as an output, the data I/O system signal being the logical combination of the first stage control signal and the row address enable signal, the row address enable signal being inactive in a precharge standby state.

20. The SDRAM of 18, further including:
a first-stage control circuit that generates a first stage control signal that is enabled in a non-power down mode and disabled in a power down mode; and
the data I/O system includes
   a data I/O circuit that receives the first stage control signal and a row address enable signal as inputs, and provides a data I/O signal as an output, the data I/O signal being the logical combination of the first stage control signal and the row address enable signal, the row address enable signal being inactive in a precharge standby state, and
   a data mask circuit that receives the first stage control signal, the row address enable signal, and a latency value as inputs, and provides a data mask signal as an output, the data mask signal being the logical combination of the first stage control signal and the row address enable signal or the latency value, the row address enable signal being inactive in a precharge standby state, the latency value being active when the latency of the SDRAM is one.

* * * * *